United States Patent [19]
Liaw et al.

[11] Patent Number: 5,554,565
[45] Date of Patent: Sep. 10, 1996

[54] MODIFIED BP-TEOS TUNGSTEN-PLUG CONTACT PROCESS

[75] Inventors: Jhon-Jhy Liaw, Taipei; Jin-Yuan Lee; Ming-Chang Teng, both of Hsin-Chu, all of Taiwan

[73] Assignee: Taiwan Semiconductor Manufacturing Company Ltd., Hin-Chu, Taiwan

[21] Appl. No.: 606,832

[22] Filed: Feb. 26, 1996

[51] Int. Cl.⁶ ............................................. H01L 21/441
[52] U.S. Cl. ........................... 437/192; 437/34; 437/190; 437/982
[58] Field of Search ............................. 437/34, 57, 190, 437/192, 978, 982; 148/DIG. 50, DIG. 133

[56] References Cited

U.S. PATENT DOCUMENTS

| | | | |
|---|---|---|---|
| 4,822,753 | 4/1989 | Pintchovski et al. | 437/190 |
| 5,238,872 | 8/1993 | Thalapaneni | 437/190 |
| 5,364,817 | 11/1994 | Lur et al. | 437/982 |
| 5,502,004 | 3/1996 | Park | 437/192 |
| 5,514,616 | 5/1996 | Rostoker et al. | 437/57 |

*Primary Examiner*—Chandra Chaudhari
*Attorney, Agent, or Firm*—George O. Saile

[57] ABSTRACT

An improved method for the fabrication of an ohmic, low resistance contact to heavily doped silicon is described using a CVD deposited tungsten plug provided with Ti/TiN barrier metallurgy. The method provides for surface planarizatiion by depositing first a layer of silicon oxide followed by a layer of borophosphosilicate glass onto a silicon wafer containing integrated circuit devices. After the glass is thermally flowed to planarize its surface, it is etched back to a suitable thickness and a second layer of silicon oxide is deposited over the now-planar surface. Contact holes are patterned in the composite silicon oxide-glass-silicon oxide structure and the exposed silicon device contacts are ion-implanted. The implant is then activated by rapid-thermal-annealing. The presence of the second silicon oxide layer prevents the upper corners of the contact openings from flowing and encroaching into the opening as would occur in its absence. Not only does this provide for void-free filling of the contact openings by the tungsten contact deposition but it also permits the use of higher temperatures for the implant anneal.

49 Claims, 4 Drawing Sheets

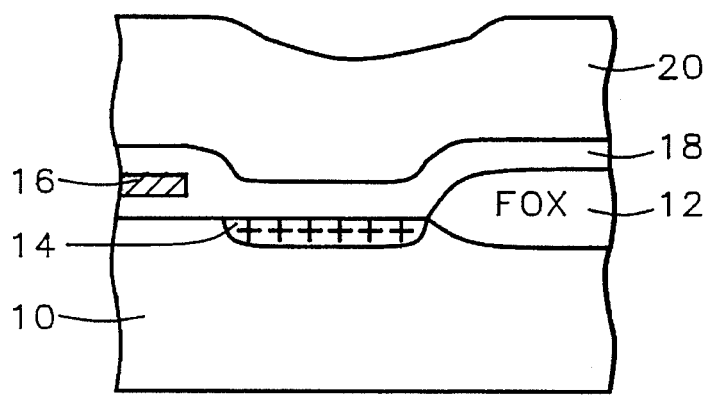
FIG. 1A – Prior Art
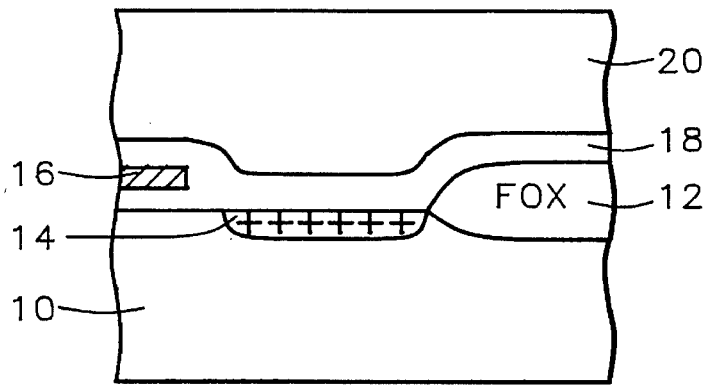
FIG. 1B – Prior Art
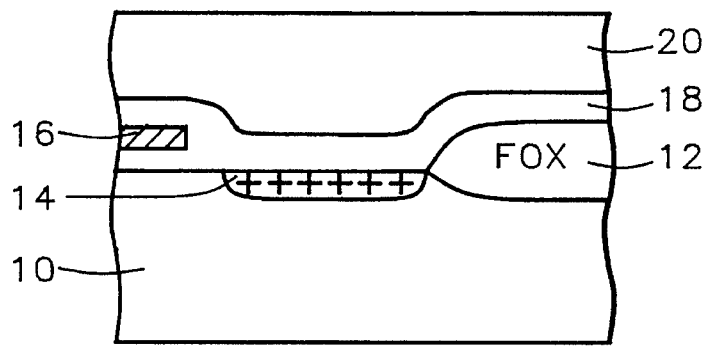
FIG. 1C – Prior Art

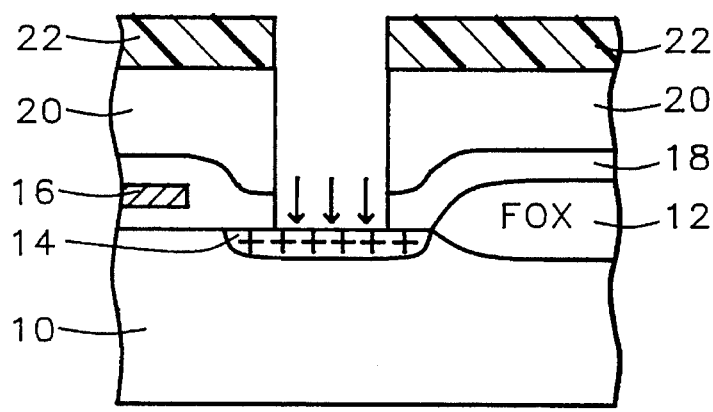
FIG. 1D – Prior Art
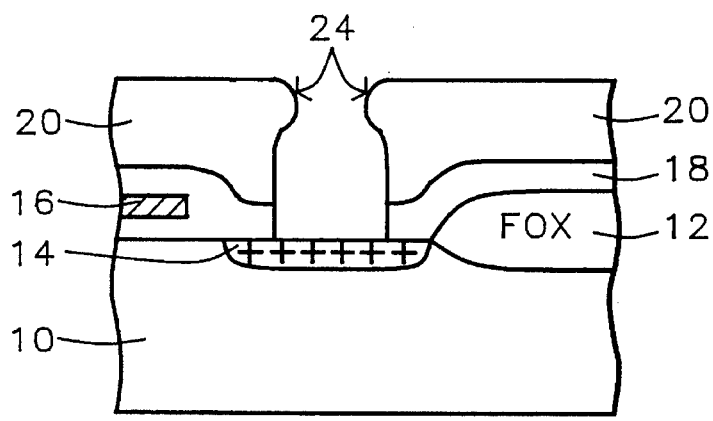
FIG. 1E – Prior Art
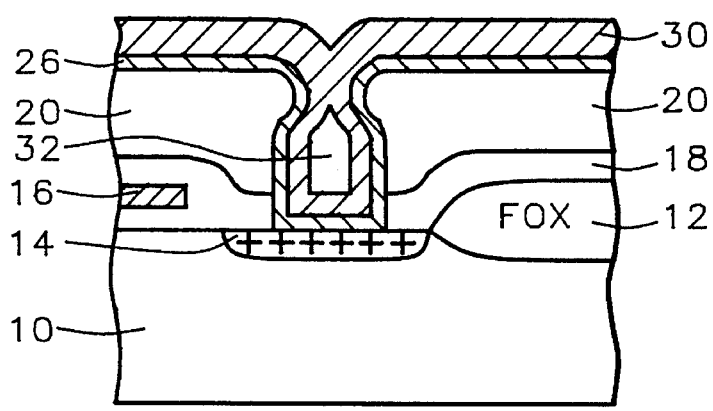
FIG. 1F – Prior Art

MODIFIED BP-TEOS TUNGSTEN-PLUG CONTACT PROCESS

BACKGROUND OF THE INVENTION

1. Field of the Invention

The invention relates to processes for the manufacture of semiconductor devices and more particularly to processes for forming metal-to-silicon contacts.

2. Description of Prior Art

Very large scale integrated circuit technology(VLSI) comprises the formation of isolated semiconductor devices within the surface of silicon wafers and interconnecting these devices with metallic wiring layers above the surface. This interconnection system usually consists of two or more levels of interconnection metallurgy, separated by insulation layers. The first layer of metallization(sometimes called the "book metal") is used to define small fundamental circuits, for example, a simple TTL gate comprised of two bi-polar transistors and two resistors. This metallization level provides the connections to the silicon devices themselves. In CMOS technology the polysilicon used for the gate electrode also provides local wiring such as connecting the gates of the n-channel and p-channel devices to each other. The first aluminum metallurgy level then provides connections to the source/drain areas and to the polysilicon gates. A second level of metal lines is then provided to interconnect these primary circuits into larger units and so on. A final layer of metallization is applied to connect the highest level of circuitry to pads which form the chip's external connections.

Connections between metal levels are made using metal filled via holes in an ILD (InterLevel-Dielectric) layer, which usually consists of silicon oxide, phosphosilicate glass(PSG), or borophosphosilicate glass(BPSG). Each level of metallurgy has a unique set of requirements which define it's composition and processing.

The first level must provide a low resistance(ohmic) contact to the silicon. Unlike metal-to-metal contacts, the metal-to-semiconductor contact is highly dependent on both the doping level and the doping type of the silicon. Current technology requires that the doping level of the silicon be of the order of $10^{20}$ atoms/cm$^3$. This level of doping provides a sufficiently narrow depletion region and sufficient electron concentration to achieve adequate electron penetration of the interfacial energy barrier.

The metal chosen for this contact must have a low electron work function as well as a low resistivity. Earlier technology used aluminum because of it's low resistivity, good adhesion, and ease of processing. However, as the technology advanced, many modifications were necessary to cope with problems that arose with decreasing device size and increasing current requirements. Aluminum still remains the basic metal of choice for integrated circuit wiring although it's properties have been improved by the addition of small quantities of silicon(Si), tungsten(W), titanium(Ti) and copper(Cu).

Device miniaturization has brought on a number of obstacles which particularly affect the silicon-to-metal contacts. The sizes of the contacts have been reduced to the sub-micron range. Attempts to adapt the deposition of aluminum, either pure or alloyed with silicon, or other refractory metals, by evaporation or rf sputtering have required the use of tapered contact openings in order to achieve good step coverage. The contact openings can be tapered by a variety of etching techniques. Earlier methods used flowed photoresist to provide a taper which was replicated in the oxide contact opening by reactive-ion-etching(RIE). Other techniques used BPSG as the insulator which was flowed prior to metal deposition to give a large angle taper along the entire opening. Thalapaneni U.S. Pat. No. 5,238,872 describes a technique wherein a Ti-TiW-AL contact is formed into a BPSG layer. The upper part of the contact opening is widened by an initial isotropic chemical etching. Then RIE is used to provide a vertical wall to the base of the contact opening.

Recent advances in contact and via technology have lead to the use of tungsten for filling contact and via openings. Tungsten has a sufficiently low resistivity and it can be deposited at temperatures below 500° C. by chemical vapor deposition(CVD) using the hydrogen or silane reduction of tungsten hexafluoride(WF$_6$). The deposition is very conformal and results in remarkably good filling of vertical walled contact hole openings. Thus the need for space-wasting tapered contact openings is eliminated. A thin layer of Ti/TiW deposited into the contact hole opening prior to tungsten deposition, provides not only a better contact and diffusion barrier to the silicon, but also greatly improves the adhesion of the tungsten to the BPSG sidewall. Although the tungsten layer can be patterned to provide lateral wiring lines, the preferred method is to pattern the layer to expose only the studs and wire these with traditional aluminum interconnection metallurgy. The studs are referred to as W-plugs.

A prior art process for forming W-plug contacts on a silicon wafer 10 substrate is shown in FIG. 1(A–F). Referring first to FIG. 1A, there is shown a cross section of a portion of a self-aligned polysilicon gate MOSFET. Shown is implant 14 representing a source or drain and the polysilicon gate 16. The silicon oxide field isolation(FOX) 12 is also shown.

A layer of dielectric material is first deposited onto the silicon surface using low-pressure-chemical-vapor-deposition(LPCVD) or plasma-enhanced-chemical-vapor-deposition(PECVD). The layer is formed by the thermal decomposition of tetraethyl orthosilicate(TEOS) at temperatures below 650° C. Doping of the layers with boron and phosphorous allows them to flow at low temperatures. In a typical application, a layer of undoped TEOS 18 is first deposited, forming silicon oxide. This is followed by a thicker layer of doped TEOS 20 which has the lower flowing temperature properties of BPSG. The initial undoped layer precludes any unwanted doping of the silicon by the BPSG.

As deposited, the surface of the BPSG layer replicates the non-planar surface of the silicon substrate. The wafer is annealed at 800° C. to 900° C. causing the BPSG to flow, thereby planarizing its upper surface(FIG. 1B). The BPSG is then etched back by reactive-ion-etching to reduce its thickness but maintaining the surface planarity as shown in FIG. 1C. Photoresist 22 is applied and the contact openings are patterned using standard photolithographic techniques. RIE is then used to form the vertical contact openings in the BPSG exposing the silicon active devices (FIG. 1D).

Although the flowing of the BPSG provides a smooth upper surface, its thickness is not necessarily exactly the same over all the contact areas of the chip. The thickness depends upon the topology of the surrounding area. Thus when the contact holes are subsequently opened by RIE, some over-etching will occur at contacts where the BPSG is thinner. Since the substrate diffusions are very shallow to begin with, any over-etching could jeopardize them. Additionally, because of device miniaturization, the area of the contact approaches that of the silicon active area. A slight misalignment of the contact mask could easily cause the contact opening to fall off the device implant area resulting in shorted junctions.

For these reasons an implant is made through the contact openings to re-enforce the active regions of the devices(represented by the arrows in FIG. 1D). The silicon in the exposed contact areas is implanted with the appropriate dopant to provide a concentration of $2\times10^{14}$ to $2\times10^{15}$ dopant atoms/cm$^2$. Some products may require only one type of contact. For example, in NMOS technology the diffused contacts can be entirely of n-type. Here, the appropriate implant may be performed without masking. For complimentary MOS(CMOS) technology, where both n- and p-type contacts are required, a first implant of p-type dopant is directed at all the contacts. Then the p-type contacts are covered with a photoresist block-out mask and the n-contacts are implanted with a higher dose of n-type dopant to over-compensate the previous p-type implant. Using this procedure eliminates the need for an additional photolithographic step to shield the n-contacts.

Under the conventional procedure, these contact implants are next activated by rapid-thermal-annealing(RTA). This causes the BPSG to flow at the upper edge 24 (FIG. 1E) and severely encroach into the contact opening if the anneal temperature is above 950° C. A Ti/TiN barrier metallization 26 (FIG. 1F) is then deposited and a barrier annealing is performed between 550° and 700° C. to secure a bond of the Ti to the silicon and to the BPSG. Finally a layer of CVD tungsten 30 is deposited to fill the contact opening. The encroachment of the BPSG into the contact opening causes a restriction to the filling of the contact hole by the tungsten 30 leaving a void 32 in the center. Depending upon the degree of the overhang and the size of the contact opening, the thin tungsten walls surrounding the void have the potential for subsequent electrical failure.

SUMMARY OF THE INVENTION

It is therefore an object of this invention to prevent BPSG flow at the top of the contact openings. This objective is achieved by the modified procedure of this invention. Accordingly, the BPSG is etched back an additional amount after the planarization flow. Next this additional amount is replaced by a depositing a layer with undoped TEOS. The silicon oxide thus formed provides sufficient high temperature stability of the upper layer to prevent the subsequently formed contact opening corners from flowing during the contact RTA annealing step. After this deposition, the contact openings are defined by photolithography and etched by RIE in the conventional manner. The contact implants are then performed and annealed. The presence of the silicon oxide layer on the surface of the BPSG permits a higher annealing temperature than does the conventional process by providing support for the contact opening walls. This results in a lower contact resistance of the metal-silicon contact. The barrier metallization is the deposited followed by filling of the contact opening with tungsten.

BRIEF DESCRIPTION OF THE DRAWINGS

FIG. 1(A–F) show the steps of a prior art process for forming a W-plug contact.

DESCRIPTION OF THE PREFERRED EMBODIMENTS

Figure 2A:
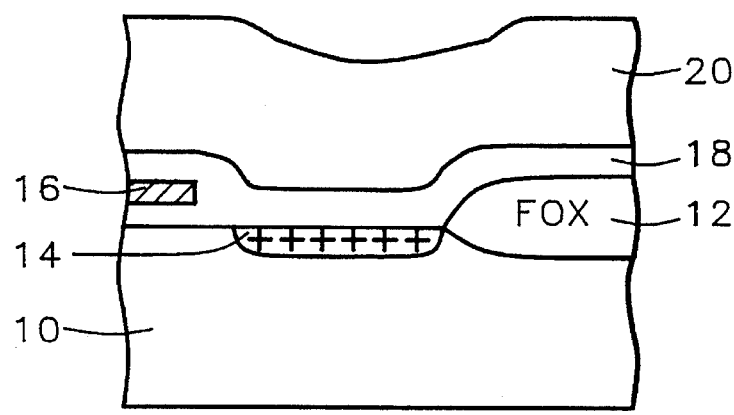
FIG. 2(A–E) show the steps of the contact forming process taught by this invention.
Figure 2B:
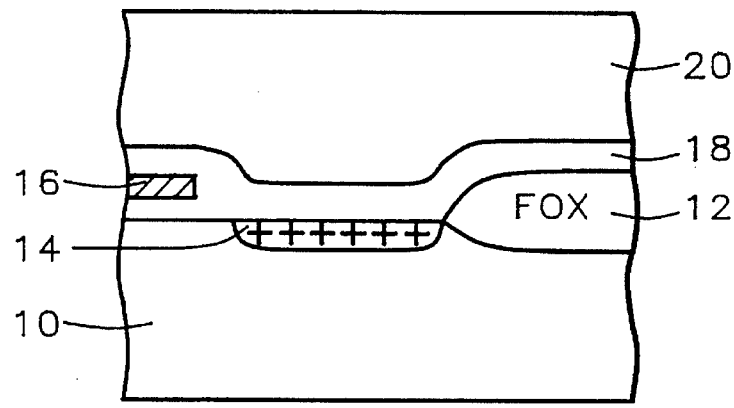

Referring now to FIG. 2A, a p-doped <100> oriented monocrystalline silicon wafer 10 is provided. Using standard processing techniques familiar to those in the integrated circuit manufacturing industry, semiconductor devices such as self-aligned polysilicon gate field effect transistors, are formed within the surface of the silicon wafer. The heavily doped source and drain implants of arsenic or phosphorous 14 comprise the active areas of these devices to which metallic contacts are later formed. A layer of 1,000 to 3,000 Angstroms of silicon oxide 18 is next deposited using PECVD or LPCVD with un-doped TEOS at temperatures between 300° C. and 700° C. Boron and phosphorous dopants are then admitted to the TEOS flow to form of borophosphosilicate glass(BPSG) 20 between 5,000 and 15,000 Angstroms thick over the silicon oxide. As deposited, the surface of the BPSG layer replicates the non-planar surface of the silicon substrate. The wafer is then annealed at 800° to 900° C. causing the BPSG to flow, thereby enhancing the planarity of it's surface(FIG. 2B).

Figure 2C:
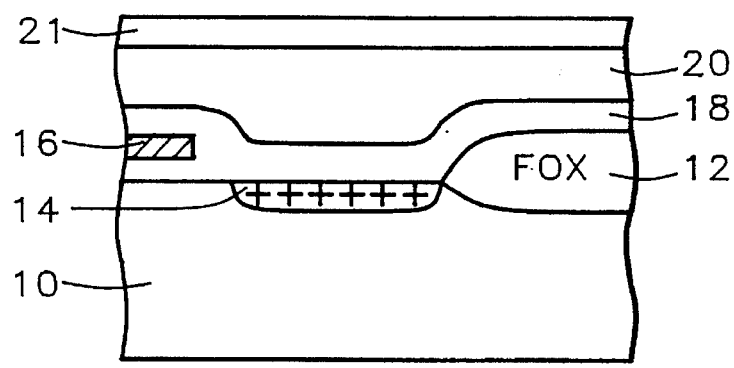

Using RIE with tetrafluoromethane(CF$_4$), the planarized BPSG layer is etched back to about 4,000 to 7,000 Angstroms. Referring now to FIG. 2C, a layer of about 2,000 Angstroms of silicon oxide 21 is then formed over the planar BPSG using either undoped TEOS or conventional PECVD using silane with oxygen or nitrous oxide. The resultant ILD layer now consists of a SiO$_2$-BPSG-SiO$_2$ sandwich layer structure.

A layer of photoresist 22(FIG. 2D) is then applied and the contact openings are patterned using standard photolithographic techniques. RIE with CF$_4$ is then used to open the contacts areas in the SiO$_2$-BPSG-SiO$_2$ sandwich layer to expose the device diffusions at the silicon surface. Appropriate etchant conditions and techniques to provide high etch-rate-ratios as well as controlled end-point-detection are well known to those practicing this art. The taper of the walls of the resultant opening can also be controlled, and the etching can be cleanly terminated at the silicon surface.

Figure 2D:
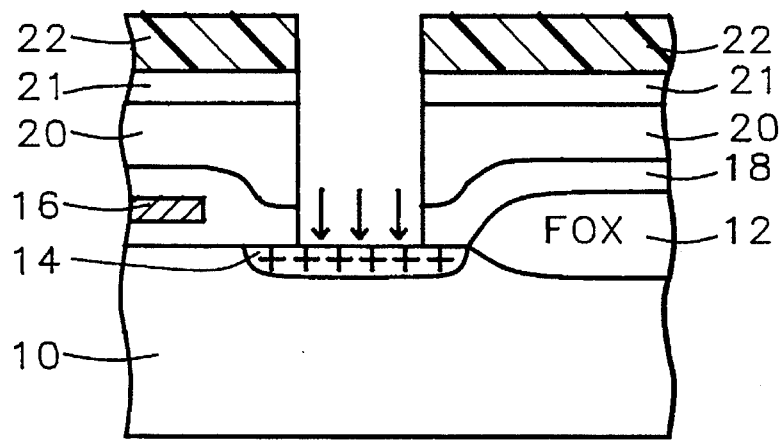

Ions of the conductivity type corresponding to that of the exposed silicon are next implanted at a dose of $2\times10^{14}$ to $2\times10^{15}$/cm$^2$ atoms and at energies of 30 to 100 keV(represented by the arrows in FIG. 2D). For this embodiment, phosphorous atoms are used to re-enforce the n-type contacts.

In another embodiment comprising CMOS product having both n- and p-type contacts, the wafer is first given a blanket boron implant using $2\times10^{14}$ to $5\times10^{14}$ BF$_2^+$ atoms/cm$^2$. Both n- and p-contacts are implanted. Next the p-contacts are covered by a photoresist block-out mask and the n-contacts are implanted with phosphorous at a dose of $1\times10^{15}$ to $2\times10^{15}$ atoms/cm$^2$. This phosphorous dose exceeds the corresponding boron dose in order to over-compensate the blanket implant. The wafer is then annealed by RTA between 800° C. and 1000° C. for 20 to 30 seconds to activate the implanted dopants.

Figure 2E:
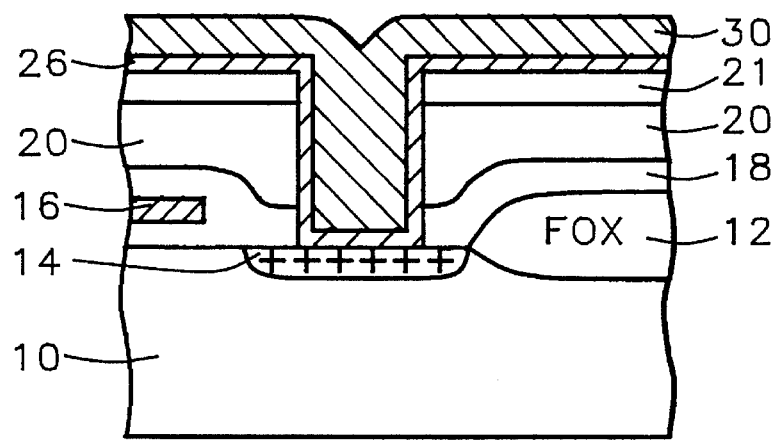

Referring now to FIG. 2E, approximately 400 Angstroms of titanium and 1,100 to 1,300 Angstroms of titanium nitride 26 are deposited onto the wafer after stripping the photoresist. These films are deposited by rf sputtering.

The barrier metallization is then annealed by RTA between 600° C. and 700° C. for 20 to 30 seconds in nitrogen. During this period the titanium layer reacts with the silicon to form TiSi$_2$ and at the same time also forms an intimate chemical bond with the BPSG and SiO$_2$ by forming titanium silicate.

A layer tungsten 30 nominally 5,000 Angstroms thick is then deposited by CVD using tungsten hexafluoride and hydrogen. The deposition is carried out in a cold-walled, low temperature CVD reactor between 415° C. and 500° C.

Because the walls of the contact openings remain vertical and undistorted, the filling by tungsten is thorough and the plug is without voids. The tungsten layer 30 is then patterned with photoresist and etched to define isolated tungsten plugs. These plugs are subsequently contacted by the preferred interconnection metallurgy.

The embodiment of FIG. 2 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

Correspondingly, whereas the embodiment uses arsenic or phosphorous as the implant for the source and drain implants in a p-type well, boron would be used as an implant in an n-type well.

While the invention has been particularly shown and described with reference to the preferred embodiments thereof, it will be understood by those skilled in the art that various changes in form and details may be made without departing from the spirit and scope of the invention.

What is claimed is:

1. A method of forming a contact to a silicon semiconductor device and providing connection to a metallic interconnection network comprising:

providing a semiconductor wafer;

forming semiconductor devices within the surface of said semiconductor wafer;

forming a first layer of silicon oxide over said semiconductor devices;

forming a layer of glass over said first layer of silicon oxide;

flowing said layer of glass by heating;

etching said layer of glass utilizing an anisotropic etching procedure;

forming a second layer of silicon oxide over said layer of glass to form a composite dielectric sandwich comprising said first layer of silicon oxide, said layer of glass and said second layer of silicon oxide;

depositing a layer of photoresist on said second layer of silicon oxide;

patterning said photoresist to define contact hole openings;

etching said composite dielectric sandwich with a unidirectional dry etching technique to provide vertical walled openings in said composite dielectric sandwich, exposing the subjacent contact regions of the semiconductor devices;

implanting dopant atoms into the contact openings;

removing said photoresist layer;

subjecting said semiconductor wafer to a first rapid thermal annealing(RTA) to activate said implanted dopant atoms;

forming a titanium layer over said semiconductor wafer;

forming a metal barrier layer over said titanium layer;

subjecting said semiconductor wafer to a second rapid thermal annealing(RTA);

depositing a tungsten layer; and etching said tungsten layer to form tungsten plugs.

2. The method of claim 1 wherein the implanted dopant atoms are at a dosage of between about $2 \times 10^{14}$ to $2 \times 10^{15}$ atoms/cm$^2$ and are implanted at energies between 30 and 100 keV.

3. The method of claim 1 wherein the semiconductor wafer is p-type.

4. The method of claim 3 wherein the implanted dopant atoms are phosphorous.

5. The method of claim 1 wherein the semiconductor wafer is n-type.

6. The method of claim 5 wherein the implanted dopant atoms are boron as $BF_2^+$.

7. The method of claim 1 wherein the first silicon oxide layer is between about 1000 and 2000 Angstroms thick.

8. The method of claim 1 wherein the first silicon oxide layer is deposited by the thermal decomposition of tetraethyl orthosilicate.

9. The method of claim 1 wherein the first silicon oxide layer is deposited at a temperature between 300° C. and 700° C.

10. The method of claim 1 wherein the glass is borophosphosilicate glass(BPSG) of between about 5,000 to 15,000 Angstroms in thickness.

11. The method of claim 1 wherein the glass is phosphosilicate glass(PSG) of between about 5,000 to 5,000 Angstroms in thickness.

12. The method of claim 1 wherein the second silicon oxide layer is deposited by PECVD from the thermal decomposition of tetraethyl orthosilicate.

13. The method of claim 1 wherein the second silicon oxide layer is deposited by PECVD from the reaction of silane with a gas selected from the group consisting of oxygen and nitrous oxide.

14. The method of claim 1 wherein the second silicon oxide layer is deposited at a temperature between 300° C. and 700° C.

15. The method of claim 1 wherein the second silicon oxide layer is deposited to thickness of between about 1,000 and 3,000 Angstroms.

16. The method of claim 1 wherein the glass is flowed at a temperature between 800° C. and 900° C.

17. The method of claim 1 wherein the unidirectional etching technique is reactive-ion-etching using tetrafluoromethane and etching parameters to provide vertical sidewalls, a high silicon-to-oxide etch rate ratio, and precise end-point control.

18. The method of claim 1 wherein the glass is etched back to a thickness of between about 4,000 and 7,000 Angstroms.

19. The method of claim 1 wherein the titanium layer is between about 300 and 800 Angstroms thick.

20. The method of claim 1 wherein the barrier metal layer is titanium nitride(TiN) and is between about 800 and 2,000 Angstroms thick.

21. The method of claim 1 wherein the barrier metal is TiW and is between about 800 and 2,000 Angstroms thick.

22. The method of claim 1 wherein the first rapid thermal annealing and the second rapid thermal annealing are accomplished in a nitrogen ambient using a halogen lamp as a heat source and lasting for a period of between 20 and 30 seconds.

23. The method of claim 1 wherein the first rapid thermal annealing temperature of the wafer surface is between 900° C. and 1000° C.

24. The method of claim 1 wherein the second rapid thermal annealing temperature of the wafer surface is between 600° C. and 700° C.

25. The method of claim 1 wherein the tungsten layer is deposited at a temperature between 415° C. to 500° C. in a cold walled, low temperature CVD system by the reduction of $WF_6$ with hydrogen.

26. A method of forming contacts to silicon semiconductor devices with both n and p type diffusions on the same semiconductor substrate and providing connection from these contacts to a metallic interconnection network comprising:

provinding a semiconductor wafer;

forming semiconductor devices with both n and p type active areas within the surface of said semiconductor wafer;

forming a first layer of silicon oxide over said semiconductor devices;

forming a layer of glass over said first layer of silicon oxide;

flowing said layer of glass by heating;

etching said layer of glass utilizing an anisotropic etching procedure;

forming a second layer of silicon oxide over said layer of glass to form a composite dielectric sandwich comprising said first layer of silicon oxide, said layer of glass and said second layer of silicon oxide and further comprising;

depositing a layer of photoresist on said second layer of silicon oxide;

patterning said photoresist to define contact hole openings;

etching said composite dielectric sandwich with a unidirectional dry etching technique to provide vertical walled openings in said composite dielectric sandwich, exposing the subjacent contact regions of the semiconductor devices;

implanting a first dose of p-type dopant atoms into the contact openings;

depositing a second layer of photoresist over said first layer of photoresist;

patterning said second layer of photoresist to expose only the contact openings to n-type contact areas;

implanting a second dose of n-type dopant atoms into said exposed n-type contact openings;

removing said first and second photoresist layers;

subjecting said semiconductor wafer to a first rapid thermal annealing(RTA) to activate said n-type and said p-type dopant atoms;

forming a titanium layer over said semiconductor wafer;

forming a metal barrier layer over said titanium layer;

subjecting said semiconductor wafer to a second rapid thermal annealing(RTA);

depositing a tungsten layer; and etching said tungsten layer to form tungsten plugs.

27. The method of claim 26 wherein said first dose of dopant atoms are boron as $BF_2^+$.

28. The method of claim 26 wherein said second dose of dopant atoms are phosphorous.

29. The method of claim 26 wherein said first dose of dopant atoms is between $2'10^{14}$ to $5\times10^-$ atoms/cm$^2$ at energies between 30 and 100 keV.

30. The method of claim 26 wherein said second dose of dopant atoms is between $1\times10^{15}$ to $2\times10^{15}$ atoms/cm$^2$ at energies between 30 and 100 keV.

31. The method of claim 26 wherein said first silicon oxide layer is between about 1,000 and 2,000 Angstroms thick.

32. The method of claim 26 wherein said first silicon oxide layer is deposited by the thermal decomposition of tetraethyl orthosilicate.

33. The method of claim 26 wherein the first silicon oxide layer is deposited at a temperature between 300° C. and 700° C.

34. The method of claim 26 wherein the glass is borophosphosilicate glass(BPSG) of between about 5,000 to 15,000 Angstroms thickness.

35. The method of claim 26 wherein the glass is phosphosilicate glass(PSG) of between about 5,000 to 15,000 Angstroms thickness.

36. The method of claim 26 wherein the second silicon oxide layer is deposited by PECVD from the thermal decomposition of tetraethyl orthosilicate.

37. The method of claim 26 wherein the second silicon oxide layer is deposited by PECVD from the reaction of silane with a gas selected from the group consisting of oxygen and nitrous oxide.

38. The method of claim 26 wherein the second silicon oxide layer is deposited at a temperature between 300° C. and 700° C.

39. The method of claim 26 wherein the second silicon oxide layer is deposited to thickness of between about 1,000 and 3,000 Angstroms.

40. The method of claim 26 wherein the glass is flowed at a temperature between 800° C. and 900° C.

41. The method of claim 26 wherein the unidirectional etching technique is reactive-ion-etching using tetrafluoromethane and conditions conducive to provide vertical sidewalls, a high silicon-to-oxide etch rate ratio, and precise end-point control.

42. The method of claim 26 wherein the glass is etched back to a thickness of between about 4,000 and 7,000 Angstroms.

43. The method of claim 26 wherein the titanium layer is between about 300 and 800 Angstroms thick.

44. The method of claim 26 wherein the barrier metal layer is titanium nitride(TiN) and is between about 800 and 2,000 Angstroms thick.

45. The method of claim 26 wherein the barrier metal is TiW and is between about 800 and 2,000 Angstroms thick.

46. The method of claim 26 wherein the first rapid thermal annealing and the second rapid thermal annealing are accomplished in a nitrogen ambient using a halogen lamp as a heat source and lasting for a period of between 20 and 30 seconds.

47. The method of claim 26 wherein the first rapid thermal annealing temperature of the wafer surface is between 900° C. and 1000° C.

48. The method of claim 26 wherein the second rapid thermal annealing temperature of the wafer surface is between 600° C. and 700° C.

49. The method of claim 26 wherein the tungsten layer is deposited at a temperature between 415° C. to 500° C. in a cold walled, low temperature CVD system by the reduction of $WF_6$ with hydrogen.

* * * * *